United States Patent [19]

Ziperovich

[11] Patent Number: 5,737,342
[45] Date of Patent: Apr. 7, 1998

[54] METHOD FOR IN-CHIP TESTING OF DIGITAL CIRCUITS OF A SYNCHRONOUSLY SAMPLED DATA DETECTION CHANNEL

[75] Inventor: Pablo A. Ziperovich, Palo Alto, Calif.

[73] Assignee: Quantum Corporation, Milpitas, Calif.

[21] Appl. No.: 656,021

[22] Filed: May 31, 1996

[51] Int. Cl.⁶ .................................................. G01R 31/28
[52] U.S. Cl. .................................................. 371/25.1
[58] Field of Search .............................. 371/25.1, 22.6, 371/22.1, 22.2, 27.2, 22.4, 27.3, 27.5

[56] References Cited

U.S. PATENT DOCUMENTS

| | | | |
|---|---|---|---|
| 4,710,747 | 12/1987 | Holland | 340/347 |
| 5,173,906 | 12/1992 | Dreilbelbis et al. | 371/22.5 |
| 5,202,626 | 4/1993 | Pham et al. | 324/158 R |
| 5,381,087 | 1/1995 | Hirano | 324/158.1 |
| 5,392,295 | 2/1995 | Coker et al. | 371/21.2 |
| 5,459,679 | 10/1995 | Ziperovich | 364/602 |

OTHER PUBLICATIONS

Ziperovich, Thesis, "VLSI Implementation of a Viterbi Detector for Hard Disk Drives", Univ. Calif. San. Diego, 1992, pp. 14, 24, 25.

*Primary Examiner*—Hoa T. Nguyen
*Attorney, Agent, or Firm*—David B. Harrison

[57] ABSTRACT

An on-chip self-test circuit for testing digital elements of a synchronous sampling data detection channel chip, such as a PRML channel of a hard disk drive, with digital pseudo samples representative of samples coming from an analog channel section, includes a sample generator generating idealized digital pseudo samples in accordance with a predetermined spectrum response, a digital noise generator generating digital noise values, a first combining circuit combining the idealized digital pseudo samples with the digital noise values to produce noisy pseudo samples, a bias injection circuit connected to the sample generator and adding a predetermined bias to the idealized digital pseudo samples to produce biased pseudo samples, and a second combining circuit for combining the noisy pseudo samples with the biased pseudo samples to put out biased noisy pseudo samples to test digital data processing and channel control elements of the channel chip.

21 Claims, 11 Drawing Sheets

| BIAS MODE | BIAS INJECTION | | | |
|---|---|---|---|---|
| | CASE A | CASE B | CASE C | CASE D |
| 000 | NO | NO | NO | NO |
| 001 | +G | +P | −P | −G |
| 010 | −P | −G | +G | +P |
| 011 | +O | +O | +O | +O |
| 100 | −O | −O | −O | −O |
| 101 | −G | −P | +P | +G |
| 110 | +P | +G | −G | −P |
| 111 | NO | NO | NO | NO |

| CASE | SAMPLE [i] | SAMPLE [i−1] |
|---|---|---|
| A | 0 | 0 |
| B | 0 | 1 |
| C | 1 | 0 |
| D | 1 | 1 |

LEGEND
O : OFFSET
G : GEIRR
P : PHASE
NO : NO BIAS

METHOD FOR IN-CHIP TESTING OF DIGITAL CIRCUITS OF A SYNCHRONOUSLY SAMPLED DATA DETECTION CHANNEL

FIELD OF THE INVENTION

The present invention relates to synchronously sampled data detection channels, such as partial response, maximum likelihood data detection channels. More particularly, the present invention relates to a method and on-board self-test circuitry for testing digital circuit elements within an integrated circuit channel chip of a synchronously sampled data detection channel.

BACKGROUND OF THE INVENTION

Application-specific integrated circuit (ASIC) chips tend to be very complex structures with many interconnected logic gates. Performance characteristics of such chips may vary, depending upon a variety of production conditions as well as design and layout considerations. As produced, chip performance must be known. Accordingly, these complex circuit chips need to be fully tested after manufacture to ensure correct operation once placed within an intended operating environment. It is known to provide an on-chip self-test system within a very large scale integrated circuit (VLSI). One frequently encountered example is to integrate a series of test cells within the chip and connect them as a ring oscillator, or counter, which in use provides an indication of digital signal transit delay through the series, and in turn, through the chip itself.

A more complex chip test regime is given in U.S. Pat. No. 5,173,906 to Dreibelbis et al., entitled: "Built-In Self Test for Integrated Circuit". The on-chip self-test system described in Dreibelbis et al. sequentially generates a series of test patterns for thoroughly testing static random access memory storage locations of the VLSI chip. The test patterns are all digital patterns, such as unique address ripple word, unique address ripple bit, checkerboard, word line strip, blanket, and a user programmable digital pattern. The patterns are sequentially written into storage locations and are compared with the patterns read from the storage locations. The results of the comparisons are reduced to a single pass-fail signal which controls a failed address register for capturing the address of any storage location that fails the test. While comprehensive, the Dreibelbis et al. test methodology appears to be directed to testing of memory word locations, rather than digital logic elements of a synchronously sampled data channel integrated circuit (IC).

Synchronously sampled data detection channel ICs typically include an analog section connected to an analog signal source, such a preamplified analog playback from a playback transducer of a disk drive, and provide analog signal processing such as gain adjustment, DC offset removal, and analog filtering and equalization; followed by a digital section starting with a high speed analog to digital (A/D) converter, frequently including a digital filter, and including a path memory detector, such as a Viterbi detector. The channel IC also typically includes timing (PLL), gain and DC offset control loops for controlling the A/D, gain, and DC offset elements, respectively.

The channel chip needs to be fully tested after manufacture to confirm correct operation once the chip is placed into the hard disk drive (or tape drive) environment and to detect any manufacturing faults or defects. Specific tests are performed on the analog and digital sections of the chip separately, and also both sections together. The digital tests involve supplying patterns to the digital section of the channel and comparing the chip's output with a known (expected) result. The digital tests further involve bypassing the analog section and the analog to digital converter, and supplying the digital section with artificial digital samples. These samples have been injected using external pins leading into the packaged chip, and are created from artificial signals with added noise in order to provide realistic simulated patterns representative of actual operating conditions of the disk drive channel. However, once the chip has been installed on a drive printed circuit board, input test pins are typically grounded, output pins are typically powered off and left unconnected, and the chip test circuitry thereupon becomes unavailable for any further testing processes.

A more comprehensive treatment of test structures and methodologies for digital circuits and systems is to be found in a book by M. Abramovici, M. Breuer, and A. Friedman, entitled: *Digital Systems Testing and Testable Design*, IEEE Press, Institute of Electrical and Electronics Engineers, Inc., New York, N.Y.

Self testing within synchronously sampled data recording and playback channel environments is known. For example, U.S. Pat. No. 5,392,295 to Coker et al., entitled: "Error Measurement Circuit", describes a circuit and methods for testing performance of a magnetic hard disk drive incorporating a partial response, maximum likelihood (PRML) channel. Test tracks having known recording patterns of encoded and precoded data values are recorded on a data storage surface. These patterns are then played back and passed to an on-drive error measurement circuit. An error generator generates error value samples by calculating a difference between the nominal, expected value of the data sample, and the value of the data sample as read from the storage surface. The error value samples may then be selectively passed through a plurality of test paths, depending upon desired testing, such as a test for nonlinear bit shift. (Bit shift is caused by interaction between magnetic boundaries of flux transition cells recorded on the disk which may result in an incorrect data pattern being reproduced.) The results of this test may be used to adjust e.g. write precompensation within the disk drive. The method described by the Coker et at. patent tests the performance of the completed disk drive, not the channel chip separately from its integration into the completed disk drive.

Another test described in the Coker et at. patent checks for changes in flying height of a data transducer above the storage surface. A further test described in the Coker et at. patent determines a level of noise in the data storage and recovery system. In this noise test error value samples are compared to a predetermined level by a comparator. If the error sample is greater than or equal to the predetermined level, the comparator puts out a logical one, otherwise a logical zero. An accumulator then separately accumulates the results, based upon an analog ternary data type being quantized in the channel, whether nominally a minus one, zero, or plus one level. A microprocessor within the disk drive obtains and plots a distribution of the accumulated results. The resultant distribution may then be used to determine the amount of noise in the disk drive system. One immediate consequence and practical drawback of the Coker et al. approach is that the entire disk drive system heads and media must be first assembled before any channel performance testing occurs in accordance with the described methodology. The Coker et al. test methodology assumes that the channel chip will be appropriately functional in order for the drive-level tests to work.

The reader is also directed to the present inventor's Masters Thesis entitled: "VLSI Implementation of a Viterbi Detector for Hard Disk Drives", University of California, San Diego, 1992, and in particular to the discussion of a test circuit within an IC including a branch metric generator unit at page 14, a pseudorandom binary sequence generator and usage of a shift-and-add property for channel self test in accordance with a primitive polynomial $x^7+x+1$ (page 24), and an input select unit (page 25) for enabling channel self test by selecting ideal pseudo samples generated by a pseudorandom generator unit. The input select unit described in the inventor's thesis also describes a full adder to enable inclusion of externally generated digital noise or interference to the selected signal. The corrupted samples are then sent through a data path of the IC, allowing for a comprehensive logic test.

While the prior approaches have provided digital testing circuits within digital VLSI chips, and have provided system-wide tests within completed hard disk drive systems employing synchronous sampling data detection techniques, a hitherto unsolved need has remained for an on-chip test system for testing digital elements of a synchronous sampling data detection channel with simulated realistic channel conditions before the chip is assembled into a completed disk drive.

As chip packages decrease in size, the number of pins available for testing the chip likewise decreases. A hitherto unsolved need has remained for a test method and arrangement which effectively overcomes a limited number of chip pinouts by using existing pins of the chip package to enable internal generation and circulation of noisy samples throughout the digital section of the channel, thereby enabling the chip to run a self-test and use a microprocessor to analyze and report test results via a serial control and status port otherwise leaving the chip.

SUMMARY OF THE INVENTION WITH OBJECTS

A general object of the present invention is to provide a comprehensive, realistic test method and internal test apparatus for testing a digital back end of a synchronous sampling data detection channel chip.

Another object of the present invention is to provide a method and circuit for adding noise and bias to ideal digital pseudo samples locally generated within an on-chip test block for testing performance of digital signal and control elements of a synchronous sampling data detection channel.

A further object of the present invention is to provide an on-chip test circuit for testing digital circuit components of a disk drive PRML data channel chip.

In accordance with principles of the present invention, a method is provided for in-chip testing of a digital section of a synchronous sampling data detection channel. The digital section includes at least an input leading from an analog to digital converter, an in-chip test block, at least one control loop digital error generator, and a digital memory detector such as a Viterbi detector. The digital section may also include one or more digital filters. The in-chip testing method preferably comprises the steps of:

injecting a sequence of known digital values (pseudo samples) at the input in lieu of digital sample values from the analog to digital converter, filtering the sequence into pseudo samples optimized to a predetermined spectrum response matching a nominal response of the detector, generating and adding a controlled amount of digital noise to the filtered pseudo samples to generate noisy pseudo samples, adding a predetermined controlled amount of offset to the noisy filtered pseudo samples to produce noisy offset pseudo samples, passing the noisy, offset pseudo samples through the digital filter, the control loop and the digital memory path detector to produce detected pseudo samples and control loop digital corrections, comparing the detected pseudo samples with the sequence of known digital values to determine any sequence miscompares and, comparing detected control loop digital corrections with nominal digital loop corrections expected from the sequence to determine any control loop digital correction miscompares and, storing any sequence miscompares and any control loop digital correction miscompares as a chip signature into miscompare storage for later extraction and analysis through e.g., a microprocessor serial bus.

As a related feature of the present invention, an on-chip self-test circuit is described for testing digital elements of a synchronously sampled data detection channel chip, such as a PRML channel of a hard disk drive, or tape drive, with digital pseudo samples representative of samples coming from an analog channel section. The self-test circuit includes a sample generator for generating idealized digital pseudo samples in accordance with a predetermined spectrum response; a digital noise generator for generating digital noise values; a first combining circuit for combining the idealized digital pseudo samples with the digital noise values to produce noisy pseudo samples; a bias injection circuit connected to the sample generator for adding a predetermined bias to the noisy digital pseudo samples to produce noisy biased pseudo samples; in order to test digital data processing and channel control elements of the chip.

These and other objects, advantages, aspects and features of the present invention will be more fully understood and appreciated by those skilled in the art upon consideration of the following detailed description of a preferred embodiment, presented in conjunction with the accompanying drawings.

DETAILED DESCRIPTION OF A PREFERRED EMBODIMENT

Figure 1:
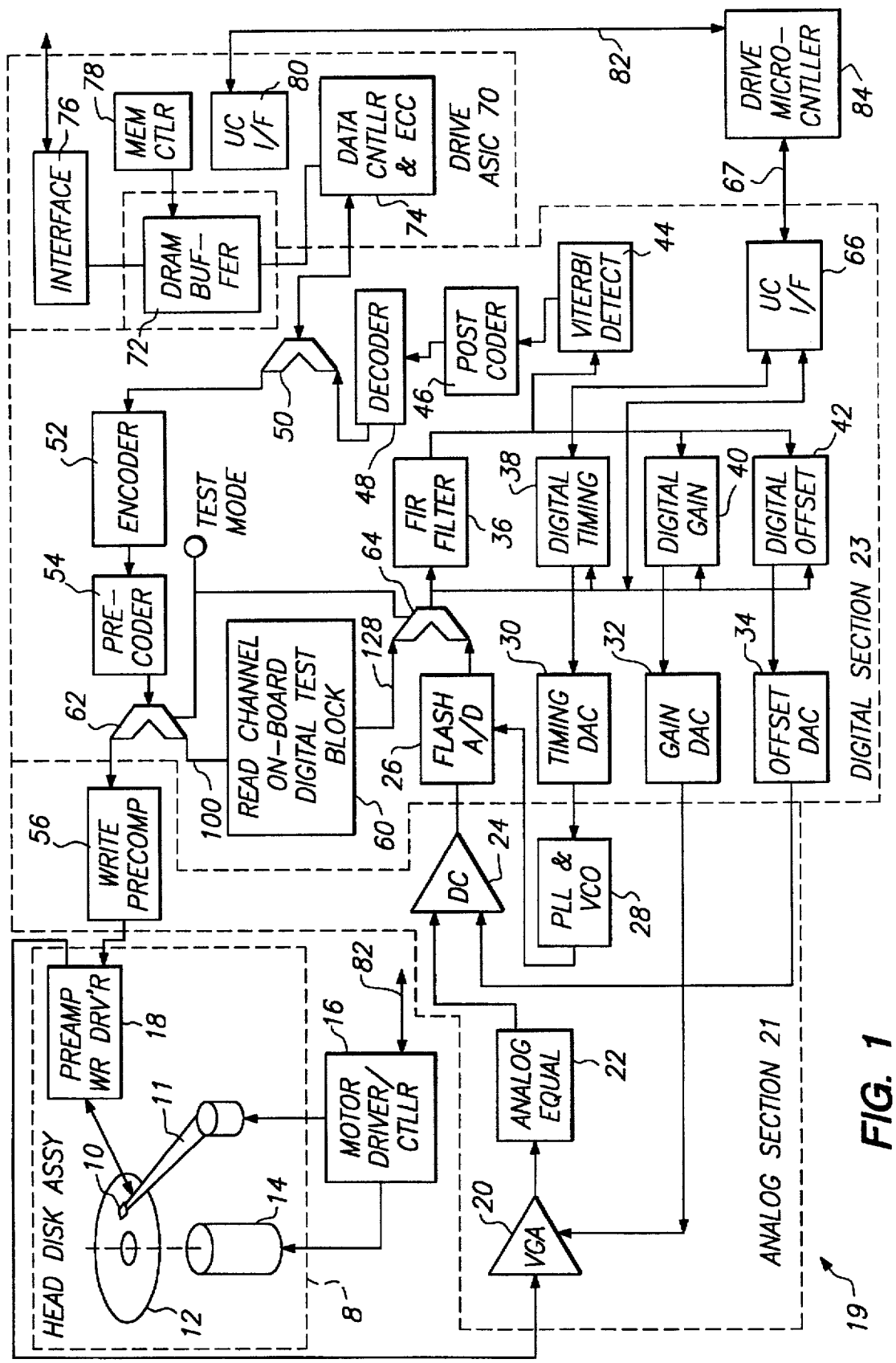
FIG. 1 is a simplified block diagram of a hard disk drive including a synchronously sampled data detection channel IC chip having on-board digital section self-testing in accordance with principles of the present invention.

In order to appreciate more fully certain aspects and features of the present invention, a brief description of one presently preferred operating environment for a channel chip with on-board self test capability will be described. Referring to FIG. 1, a highly diagrammatic depiction of a hard disk drive is presented. While a hard disk drive is a presently preferred environment of the present invention, other synchronously sampled data detection channels, including channels within a tape drive, would benefit from inclusion of the present invention.

The FIG. 1 disk drive comprises a head-disk assembly 8 including a data transducer head 10 which is positioned by an actuator assembly such as a rotary voice coil actuator 11. The head 10 provides a data writing and data reading function, and these functions may be carried out by a single magnetic transducer, or the head 10 may include e.g. an inductive writer and a magneto-resistive reader. At least one data storage disk 12 is rotated relative to the transducer 10 at a fixed predetermined velocity by a spindle motor 14, controlled by a motor control circuit 16 which may also include circuitry for controlling the rotary voice coil actuator 11. An analog playback preamplifier and write driver integrated circuit 18 is also typically included within the head-disk assembly in order to minimize lead lengths between the circuit 18 and the transducer head 10 to reduce extraneous noise pickup and to improve signal to noise ratio in the played back analog signal transduced from the disk 12.

The hard disk drive includes a VLSI PRML data channel chip 19, including e.g., an analog section 21 and a digital section 23. The analog section 21 typically includes a variable gain analog amplifier (VGA) 20, a programmable analog filter/equalizer 22, a DC offset correction amplifier 24 leading to an e.g. 6-bit flash analog to digital converter (A/D) 26, and a voltage controlled oscillator (VCO) for controlling synchronous sampling operations performed by the A/D upon the amplified and filtered/equalized analog signal stream. A write precompensation circuit 56 may also typically be included within the analog section 21 of the channel chip 19.

The digital section 23 of the channel chip typically includes the flash A/D 26, a finite impulse response (FIR) filter 36, a memory path detector, such as a Viterbi detector 44, a digital timing control circuit 38 for providing a timing adjustment control via a timing digital to analog converter (DAC) 30 to the VCO 28, a digital gain control circuit 40 for applying a gain control via a gain control DAC 32 to the VGA 20, and a digital offset control circuit 42 for applying a DC offset control value via an offset DAC 34 to the offset correction amplifier 24. While digital timing, gain, and offset control circuits 38, 40 and 42 are shown, these circuits may be combined with analog control circuits and elements located within the analog section 21, as shown for example in commonly assigned U.S. Pat. No. 5,341,249 to Abbott et al., entitled: "Disk Drive Using PRML Class IV Sampling Data Detection with Digital Adaptive Equalization", and Pat. No. 5,459,679 to the present inventor, entitled: "Real-Time DC Offset Control and Associated Method", the disclosures thereof being incorporated herein by reference.

The digital section 23 further includes a postcoder 46 and a decoder 48 for postcoding and decoding the coded information recovered at the Viterbi detector 36. On the write path side, an encoder 52 and a precoder 54 encode and precode user data into a coded data pattern having a desired spectrum (e.g. PR4) suitable for writing on the disk 12 in a pattern manifesting controlled intersymbol interference. A bidirectional data flow control circuit/interface 50 directs unencoded signals to the encoder during data writing operations via e.g. a four bit data path 51, and it directs decoded signals from the decoder 48 to external circuitry during data playback operations, in accordance with a read/write (R/W) control signal.

The digital section 23 further includes a microcontroller interface 66 for receiving commands from a drive microcontroller 84 via a serial data path 67. The interface 66 also includes a number of internal registers for storing commands and status values which are directly accessed by the microcontroller 84 via the serial path 67.

The digital section 23 further includes a test block 60 incorporating elements and features comprising the present invention, including e.g., a first signal diverter 62 and a second signal diverter 64. The first signal diverter 62 diverts coded digital values put out by the precoder 54 from the write precompensation circuit 56 into the test block 60. The second signal diverter 64 diverts a signal path 65 into the FIR filter 36, digital timing control 38, digital gain control 40 and digital offset control 42 from receiving unconditioned samples from the flash A/D 26 to receiving test samples from the test block 60. The first and second signal diverters 62 and 64 are shown as signal multiplexers, and they are controlled by a test mode signal generated by the microcontroller interface block 66 in response to commands received via the serial port 67 from an external microcontroller, such as (but not necessarily limited to) the drive microcontroller 84. The test block 60 and related circuitry and features will be described in greater detail hereinafter.

In addition to the channel chip 19, a drive printed circuit board also includes, carries and connects the motor control chip 16, the microprocessor 84, a drive ASIC 70 and an external buffer memory array 72 preferably, but not necessarily implemented as dynamic random access memory (DRAM). The drive ASIC 70 includes a data controller 74 which has a resident error correction code (ECC) function, a disk drive to host interface block 66 for implementing a desired disk interface convention such as the Small Computer Standard Interface (SCSI) or any other bus level interface structure for a host computer, a memory controller block 78 for generating addresses and refresh signals for the external DRAM buffer memory array 72, and a microcontroller interface 80 for receiving commands from, and returning status values to, the microcontroller 84 via a control bus structure 82. In the present example, the microcontroller 84 can generate a stream of known unencoded data values and cause them to be passed to the digital section 23 of the channel chip 19 via the bus 82, ASIC/microcontroller interface 80, dam controller 74 and path 51. At the same time, the microcontroller 84 may monitor responses of the digital section 23 to test pattern sequences via the channel/microcontroller interface 66 and serial port 67. This control and monitoring path arrangement is highly useful in certain preferred implementations of the present invention, as will be more fully appreciated from the following discussion.

Figure 2:
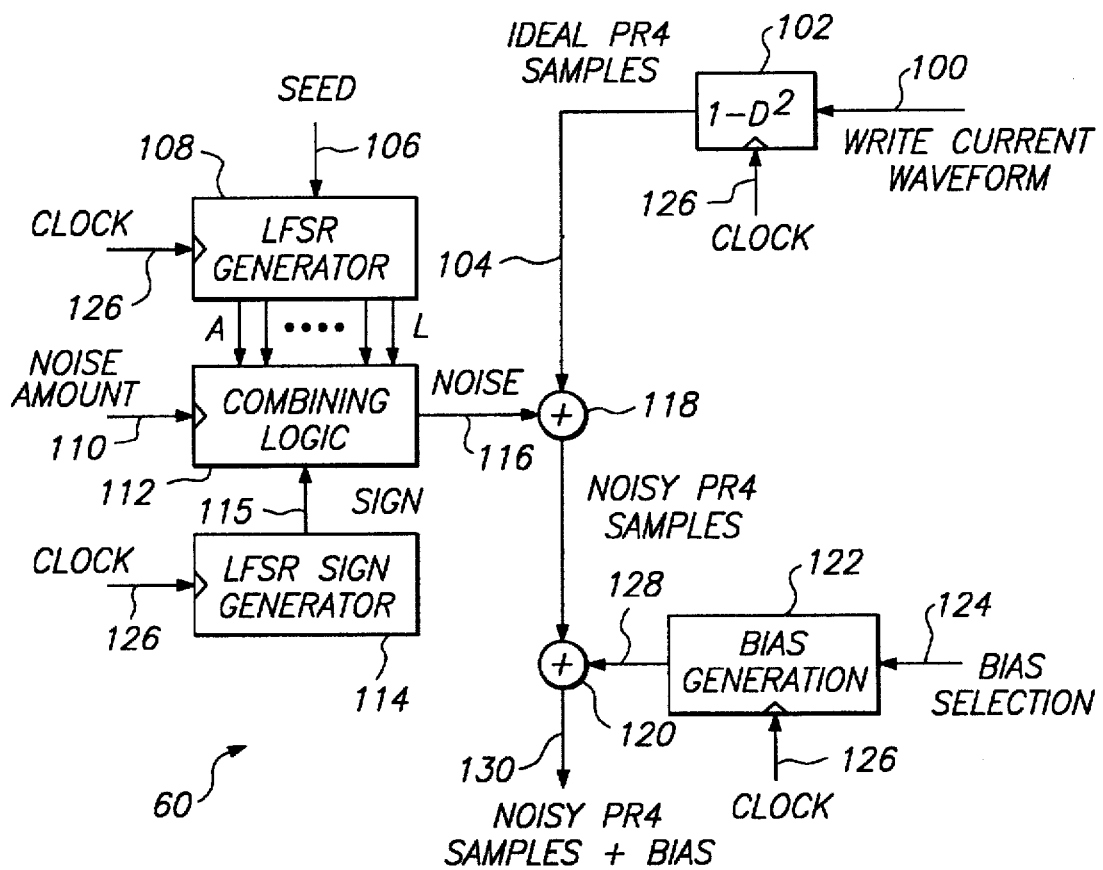
FIG. 2 sets forth a simplified block diagram of an on-board digital self-test circuit within the FIG. 1 channel chip digital section for generating test conditions.

Turning now to FIG. 2, the on-chip digital section test block 60 includes an input path 100 for receiving a known write current digital waveform, such as coded data from the precoder 54, or an equivalent source, depending upon the testing environment. In the present example, the incoming data values are passed through a 1-$D^2$ function 102 which imparts an ideal three level (ternary) PR4 data pattern as graphed in FIGS. 8 and 9, for example. The function 102 provides e.g. an ideal pattern over a path to a summing function 118. For example, the following represents an output of the 1-$D^2$ function in response to binary sample values:

| Binary samples: | 1 | 1 | 0  | 0  | 1 | 1 | 0  | 0  |
|---|---|---|---|---|---|---|---|---|
| 1-$D^2$ output: | 1 | 1 | -1 | -1 | 1 | 1 | -1 | -1 |

While ideal PR4 samples are generated by the 1-$D^2$ function 102 in the presently preferred embodiment, those skilled in the art will appreciate that the samples do not have to be "ideal". Non-idealized samples may be generated from a given polynomial P(D), and the FIR filter 36 may be used to equalize the samples to the desired spectral response. This polynomial may be expressed as a more generalized statement, as follows:

$$P(D)=h(0)+h(1)D+h(2)D^2 \ldots +h(n)D^n.$$

Within this more generalized expression, for P(D)=1-$D^2$, h(0)=1, h(1)=0, and h(2)=-1 (and wherein terms of D>2=0).

Figure 3:
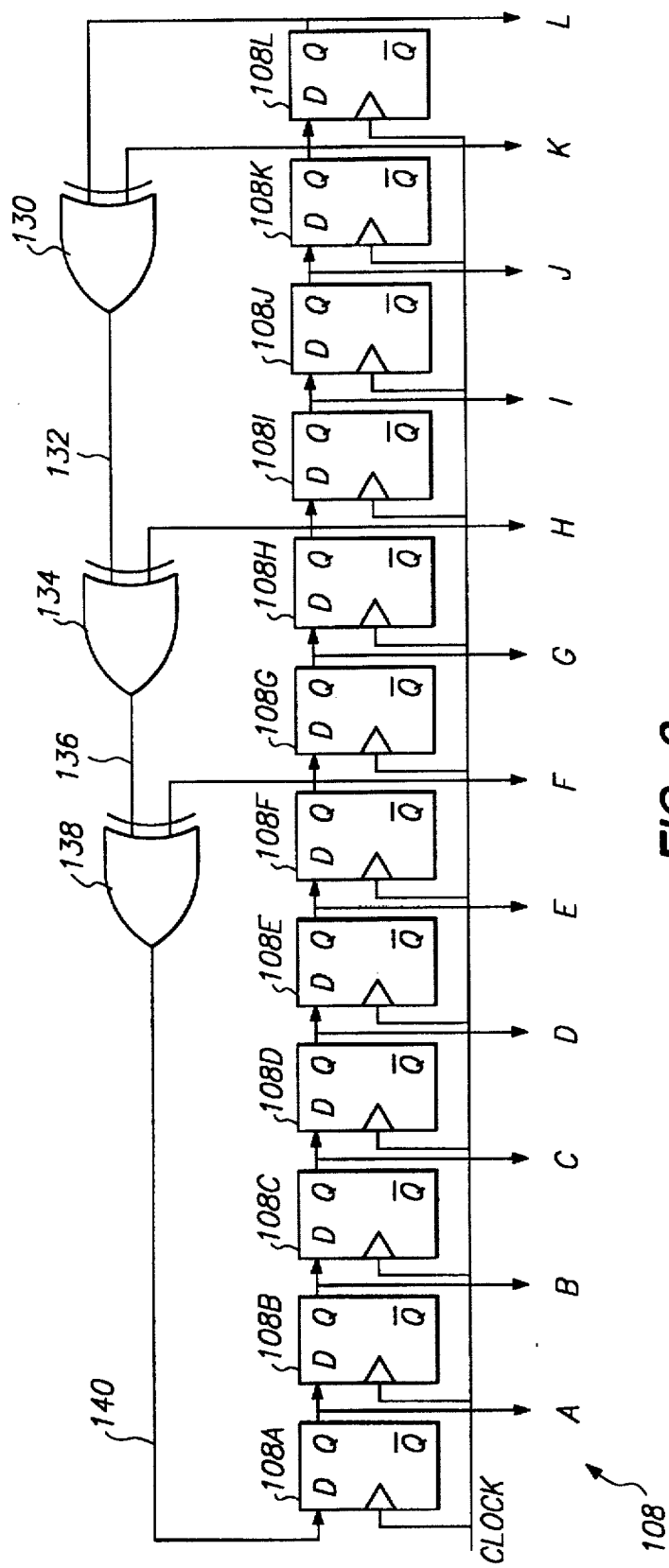
FIG. 3 sets forth a detailed block diagram of a 12-bit linear feedback shift register (LFSR) within the FIG. 2 self-test circuit.

Noise generation is based upon a predetermined seed digital value 106 which is loaded from a register of the interface 66 into a linear feedback shift register (LFSR) 108 configured to generate a pseudorandom binary sequence. The seed may be any suitable value. The seed value selected will change the relationship between the data and the noise. The noise is generated by the LFSR 108 implementing a primitive polynomial (any primitive polynomial will work). A 12-bit LFSR generates all possible 12 bit combinations (4095) except an all-zero word. A 12-bit LFSR 108 as shown in FIG. 3 implements a primitive polynomial $x^{12}+x^6+x^4+x+1$. There are 12 flip-flops 108A, 108B, 108C, 108D, 108E, 108F, 108G, 108H, 108I, 108J, 108K and 108L, arranged as shown in FIG. 3. The flip-flops 108A-108L are clocked in common in accordance with a clocking signal synchronized to the sample rate. This circuit 108 generates all 57,330 noise combinations (4095·14). Alternatively, and with a greater number of logic gates, a one-half rate test circuit may be implemented, which would essentially duplicate the circuitry of FIG. 2, with one half devoted to each one of two one-half clock rate channel interleaves.

Returning to FIG. 3, each flip-flop provides a non-inverting output tap labeled A-L, corresponding to outputs from latches 108A-108L as shown in FIG. 3. The taps A-L are used to generate noise. The taps of the LFSR 108 are mixed in a particular way to obtain as closely as possible a desired noise distribution. Following the A-L tap naming convention described above, and given that the taps are independent due to the properties of the LFSR 108, one can compute, for example, the following probabilities:

| | |
|---|---|
| P0 | = p(1) = 0.5 |
| P1 | = p(AB+e,cir +ee CD) = p(AB) + p(CD) − 2p(AB)p(CD) |
|    | = 0.25 + 0.25 − 2(0.25)(0.25) |
|    | = 0.375 |
| P2 | = p(ABCD + EFG) = p(ABCD) + p(EFG) − p(ABCD)p(EFG) |
|    | = 0.0625 + 0.125 − (0.0625)(0.125) |
|    | = 0.1796875 |
| P3 | = p(ABCDEF + GHIJK) = p(ABCDEF) + p(GHIJK) |
|    | − p(ABCDEF)p(GHIJK) |
|    | = 0.015625 + 0.03125 − (0.015625)(0.03125) |
|    | = 0.0463867 |

With the selected primitive polynomial described above, taps K (x) and L (1) are fed back through a first exclusive-OR gate 130 having an output 132. Output 132 and tap H ($x^4$) are fed through a second exclusive-OR gate 134 providing an output 136. Output 136 and tap F ($x^6$) are fed through a third exclusive-OR gate 138 providing an output 140 which feeds data ($x^{12}$) into the first latch 108A. The outputs of the above equations are mapped by combining logic circuitry 112 shown in FIGS. 4A and 4B to corresponding binary digits to make the least significant bit of the noise to have the higher probability; and, the higher the index, the lower the probability. Accordingly, the mapping is as follows: noise[3:0]={P3,P2,P1,P0}(for high noise); and noise[3:0]={0,P3,P2, P1}(for low noise).

Figure 4A:
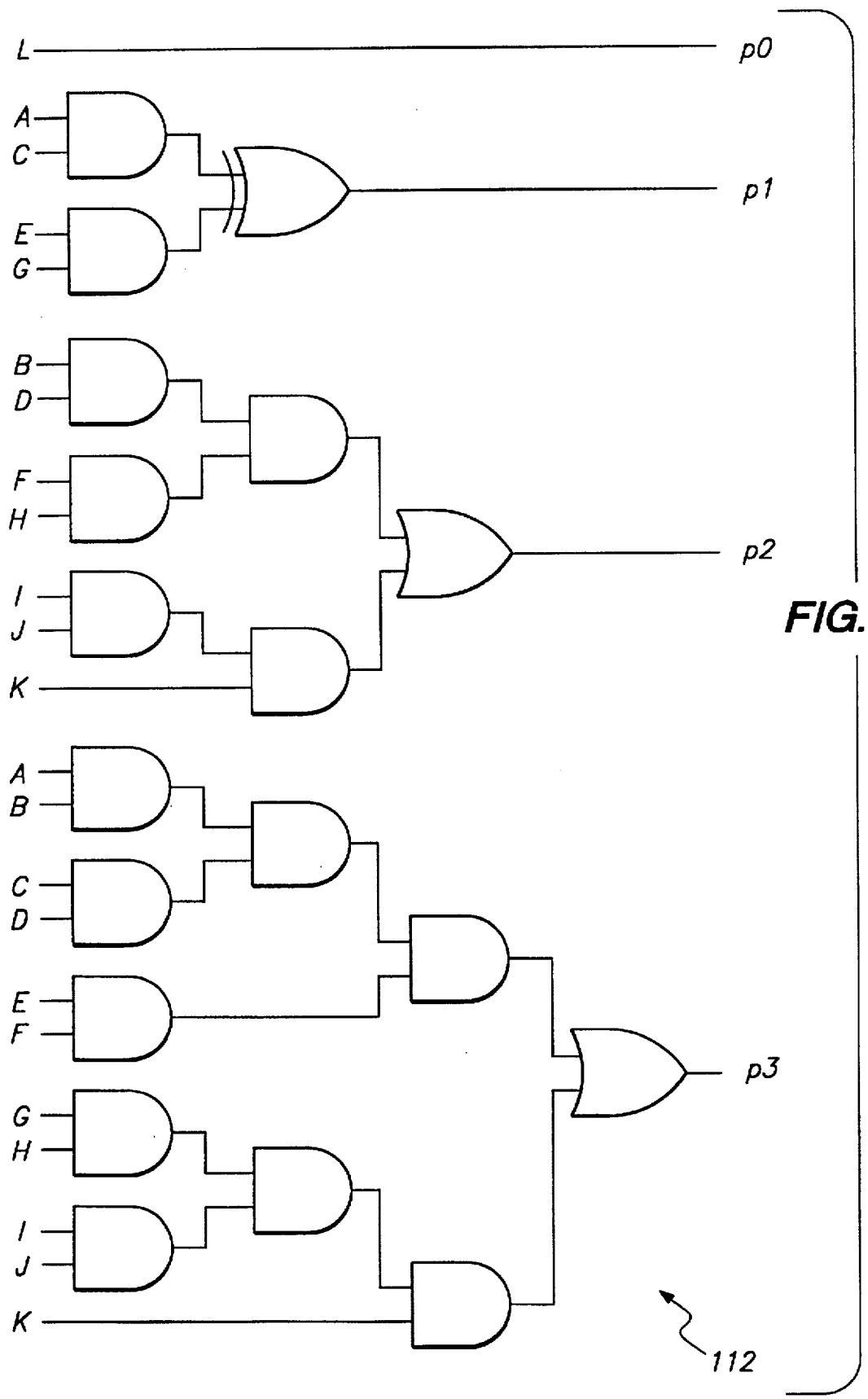
FIG. 4A sets forth a detailed logic block diagram of a first portion of a combining logic block; and, FIG. 4B sets forth a second portion completing the combining logic block, within the FIG. 2 self-test circuit.
Figure 4B:
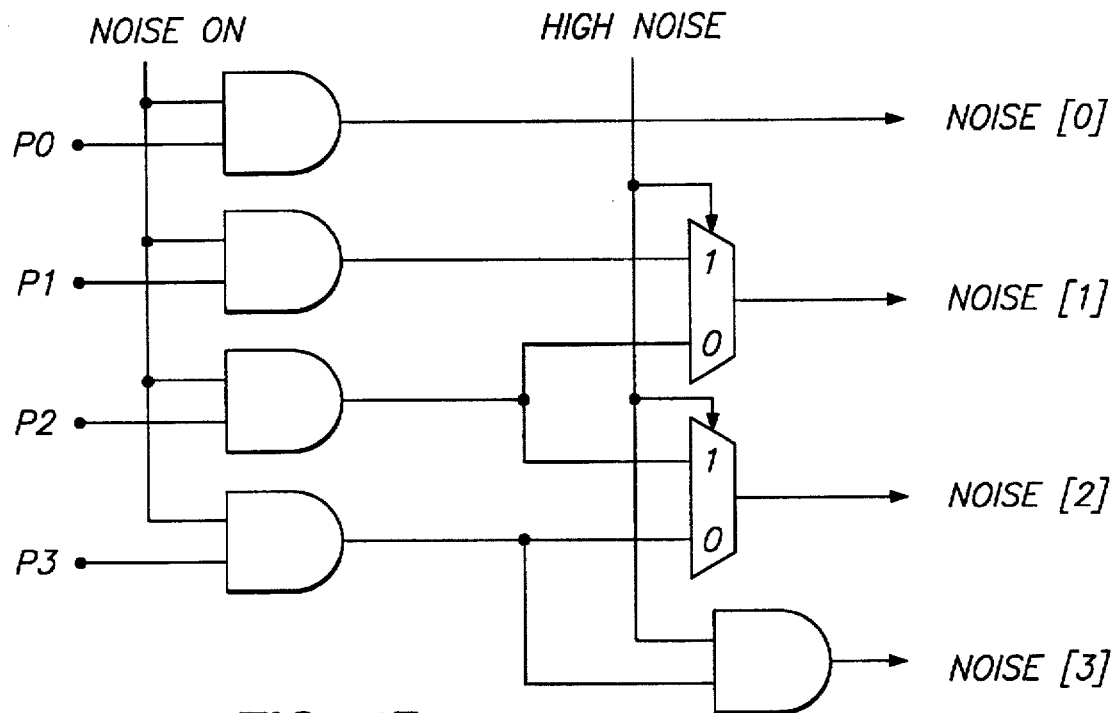
Figure 5:
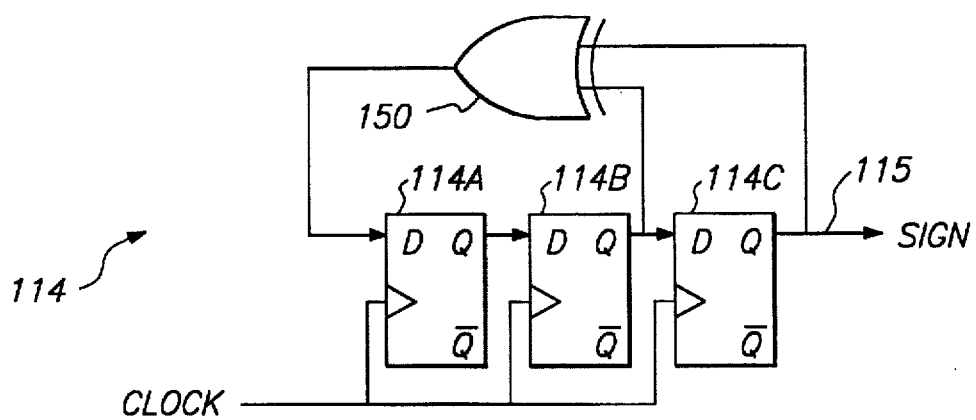
FIG. 5 sets forth a detailed block diagram of a 3-bit LFSR within the FIG. 2 self-test circuit.
Figure 10:
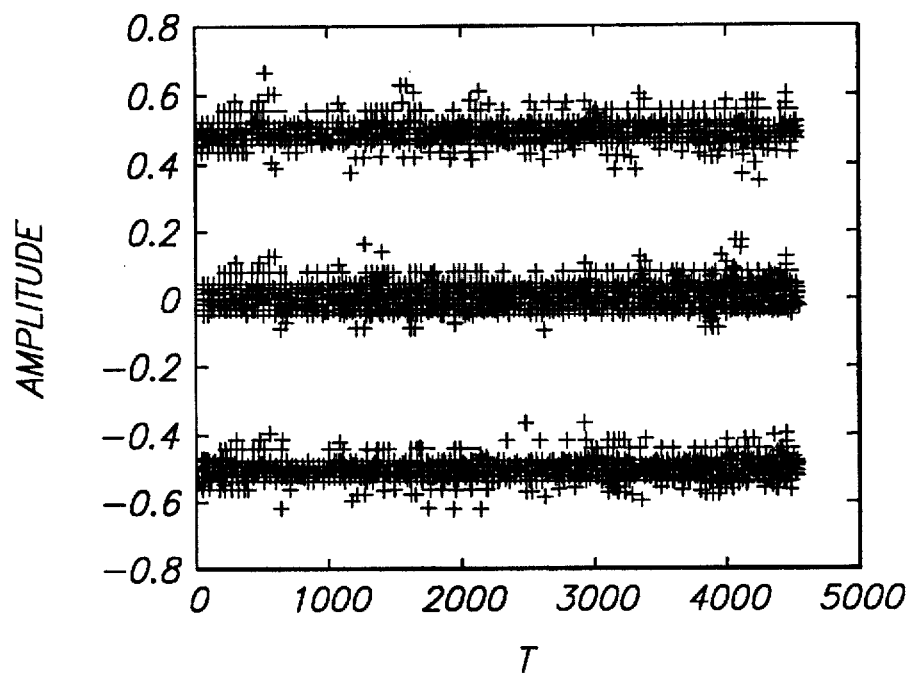
FIG. 10 is a graph similar to the FIG. 8 graph and showing a first multiplicity of noisy PR4 sample values.
Figure 11:
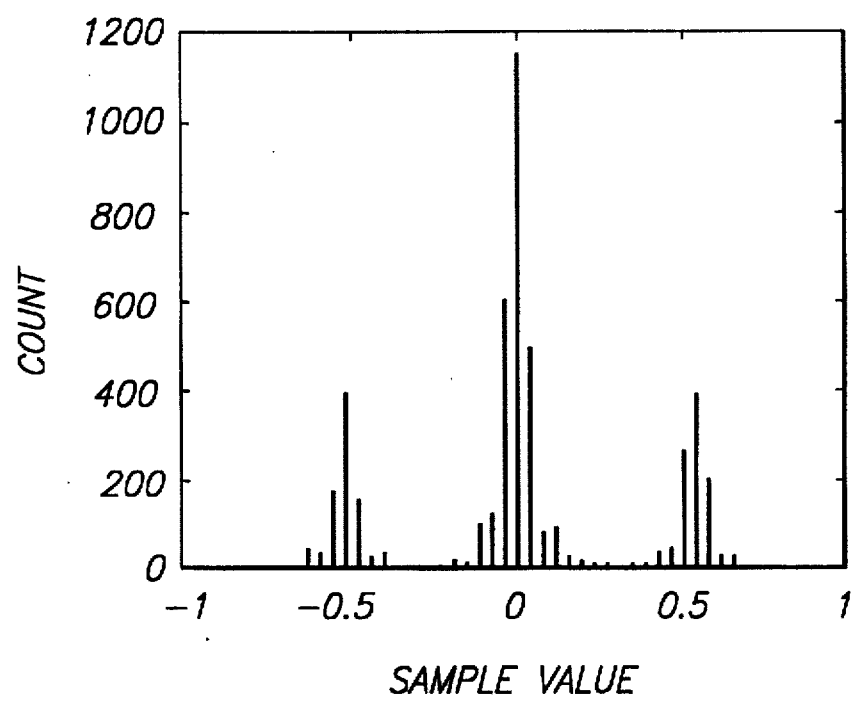
FIG. 11 is a histogram of the FIG. 10 noisy sample values.
Figure 12:
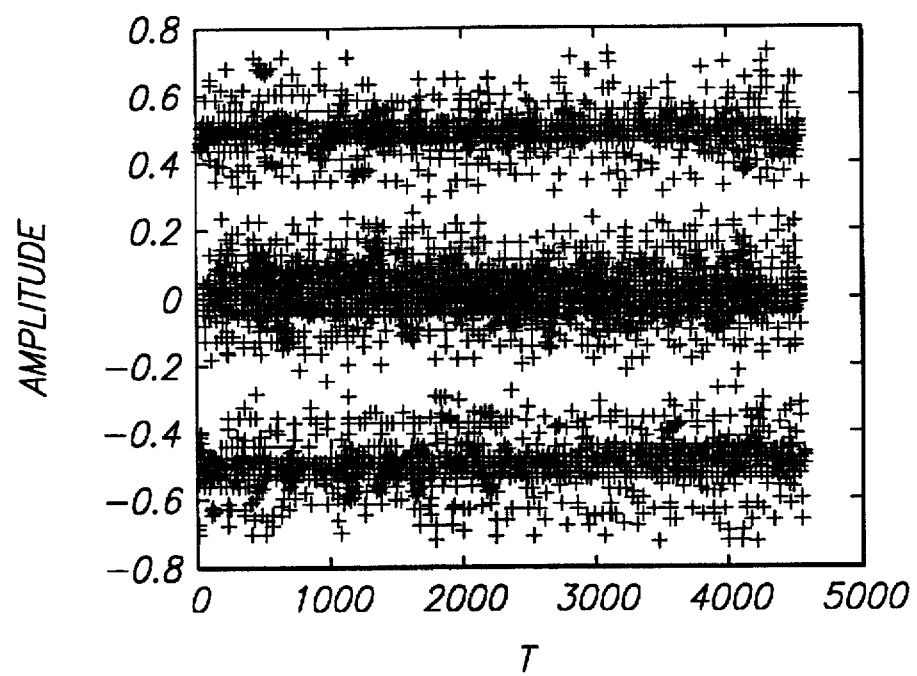
FIG. 12 is a graph similar to the FIG. 8 graph and showing a second multiplicity of noisy PR4 sample values, noisier than the FIG. 10 example.
Figure 13:
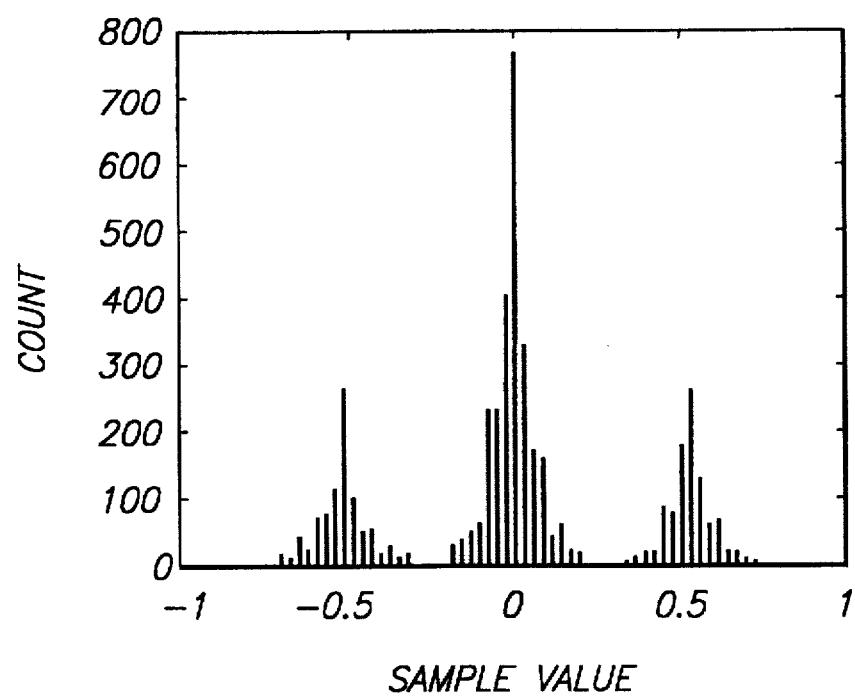
FIG. 13 is a histogram of the FIG. 12 noisier sample values.

The probabilities P3, P2, P1 and P0 are realized with the combining logic array illustrated in FIG. 4A. A four bit noise word NOISE [0–3] on path 116 of FIG. 2 is generated by the logic depicted in FIG. 4B. The FIG. 4B logic receives the P0, P1, P2 and P3 probabilities, and puts out noise, either in response to a NOISE_ON condition resulting in a low noise spectrum graphed e.g. in FIGS. 10–11, or a very noisy spectrum in accordance with a HIGH_NOISE control, resulting in a high noise spectrum graphed e.g. in FIGS. 12–13. The noise generation function can also be turned completely off when desired.

The LFSR sign generator 114 is provided in order to make the expected value of the noise sum to a zero mean amplitude. The 3-bit LFSR generator 114 generates a 7 bit sequence implementing the primitive polynomial $x^3+x+1$. Its output is a sign bit on a path 115 which is used to control the sign of the noise. As shown in FIG. 4, the LFSR sign generator 114 includes three latches 114A, 114B, and 114C connected as shown and clocked at the same sample clocking rate applied to the LFSR 108. Non-inverting outputs from the latches 114B and 114C are passed through an exclusive-OR gate 150 having an output feeding a data input of the latch 114A. The combinatorial logic 112 receives e.g. a repeating sequence such as 1110010. By inspection there are more 1s than 0s in this sequence. The sign generator 114 inspects this sequence and switches a logical sign output on path 115, such that the noise is zero mean, as follows:

| | |
|---|---|
| Incoming | 1110010111001011100101110010111001 |
| Sign bit | 1111101000001011111010000101111101. |

Figure 8:
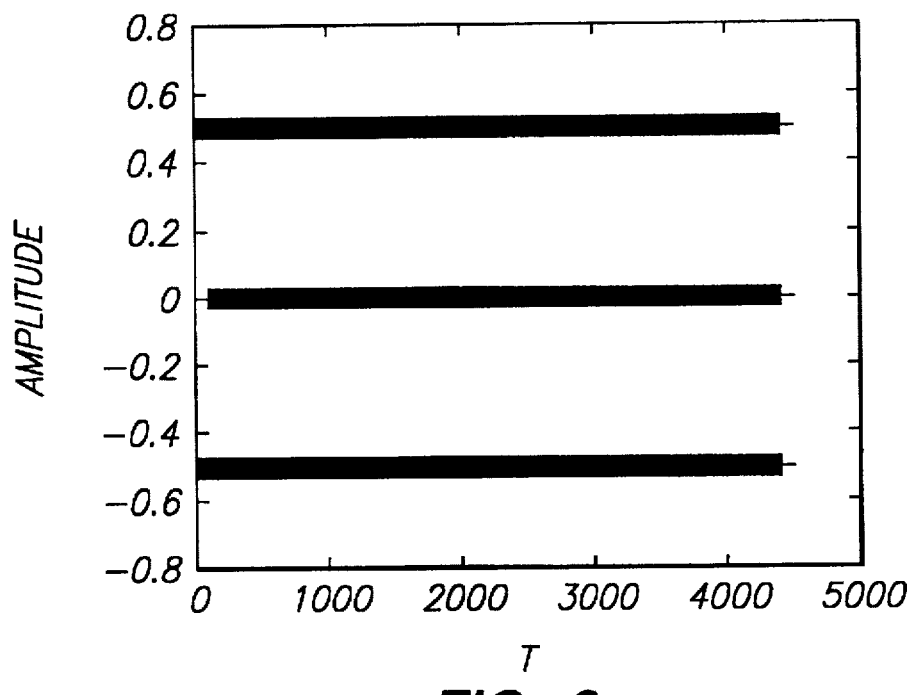
FIG. 8 is a graph of a multiplicity of ideally generated PR4 ternary sample values.
Figure 9:
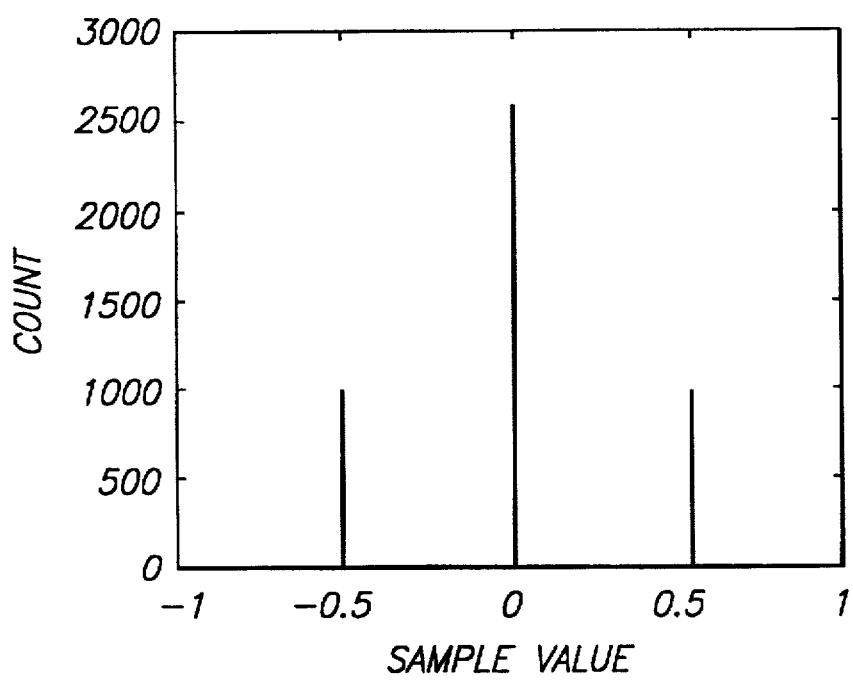
FIG. 9 is a graph of a histogram of the FIG. 8 ideally generated PR4 sample values.

The combining logic 112 combines the noise bits A–L and the sign bit on path 115 with a noise weighting value on the path 110 which Controls amplitude of the noise on the path 116. The noise on the path 116 is then added to the corresponding ideal PR4 samples on the path 104 by the combining function 118 to create noisy 6-bit words (pseudo samples) which are injected into the FIR filter input path 65 via the test selector 64. The resultant noisy pseudo samples are depicted in FIGS. 8 and 9.

As thus described, the pseudo samples appear to be perfectly equalized, with correct gain, phase, and DC offset, with the only artifact being addition of zero mean noise. Accordingly, these pseudo samples are suitable for only exercising and testing the FIR filter 36 and the Viterbi detector 44 and decoder logic. In order to exercise and test the digital timing control 38, the digital gain control 40, the digital DC offset control 42, and quality monitor (mean squared error), a bias must be introduced. Accordingly, the bias generation circuit 122 generates a predetermined amount of bias, whether phase, gain or DC offset. While DC offset bias may be applied to any test or data pattern, in the present example, the bias injection method including gain and phase bias is applied to a periodic (4T or sine wave) pattern as is conventionally present in a preamble pattern. The bias generation circuit 122 may be programmed to add, for example, one least significant bit of phase, amplitude or DC offset bias to the ideal samples before or after noise injection at function 118. The biased ideal pseudo samples may then be combined with the noisy pseudo samples in the combining function 120 to provide the output on the path 128.

Figure 6A:
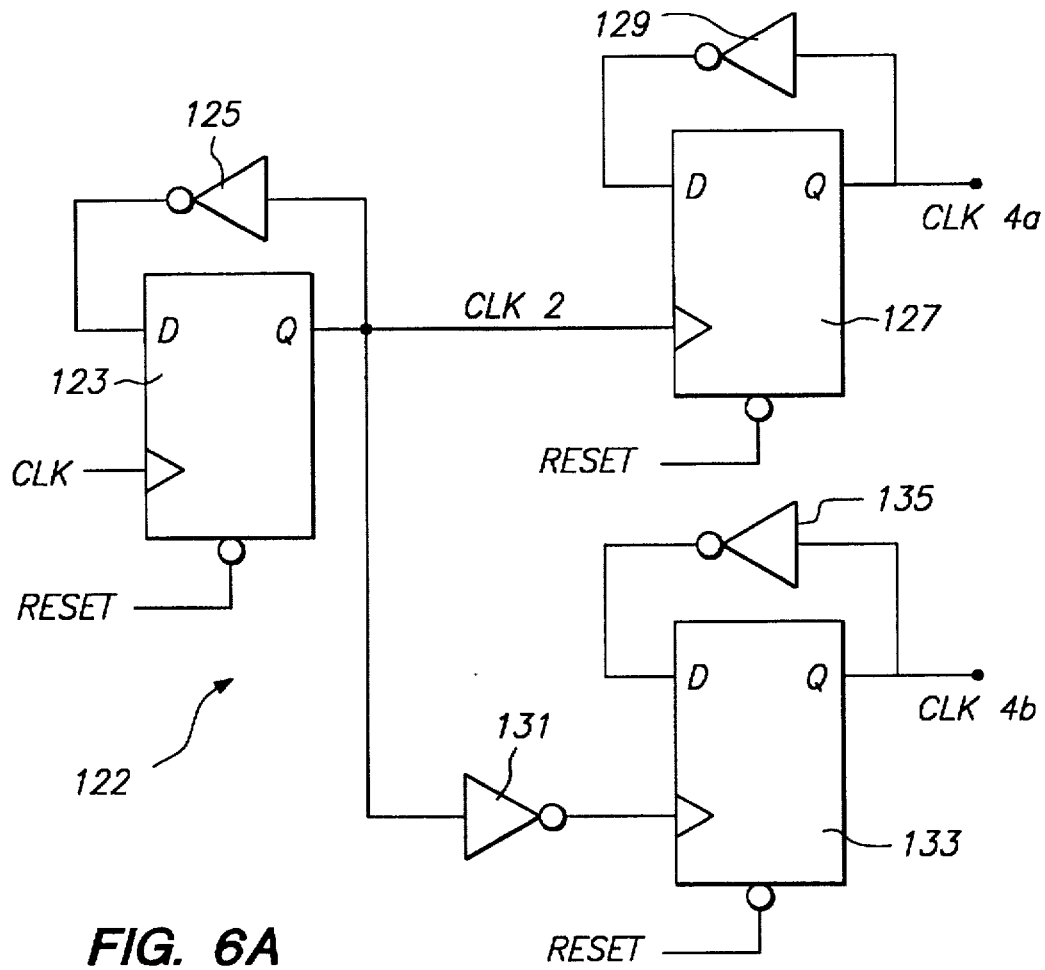
FIG. 6A sets forth a detailed logic block diagram of a bias control signal generator within the FIG. 2 self-test circuit.
Figure 6B:
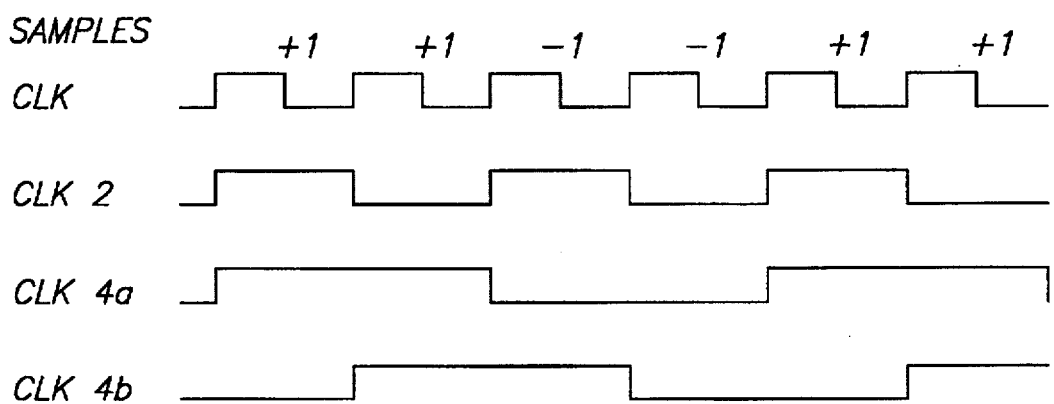
FIG. 6B sets forth a graph of control signals generated by the FIG. 6A circuit.

FIG. 6A illustrates a circuit implementation of the bias generation circuit 122. In the illustrated implementation, a flip-flop 123 is clocked by a data sample clock (4T per preamble cycle, each T representing one sample). An inverter 125 feeds an inverse of an output logical condition (Q) to the data input (D). The output (Q) of flip-flop 123 provides a CLK2 condition, graphed in FIG. 6B. A flip-flop 127 and associated inverter 129 provide a CLK4$a$ logical condition, and an inverter 131, flip-flop 133 and feedback inverter 135 provide a clock CLK4$b$, both of which are graphed in FIG. 6B.

Figures 6C, 6D:
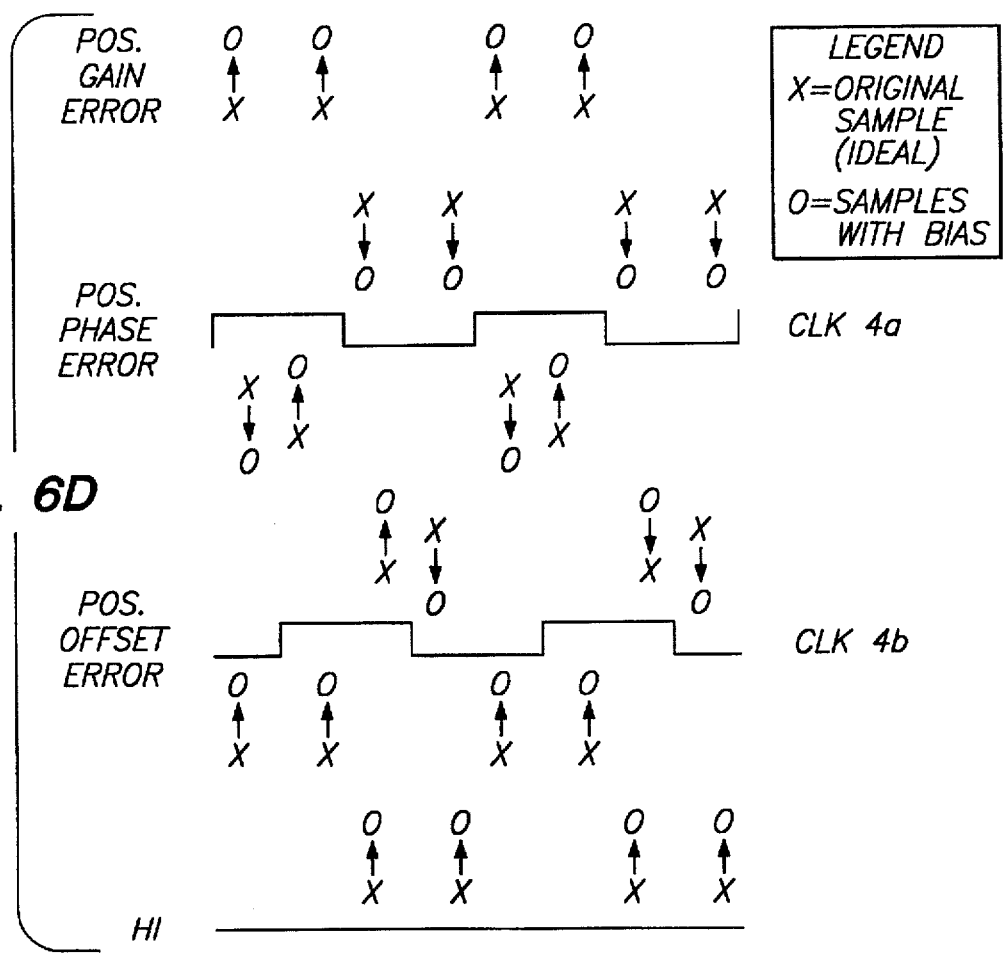
FIG. 6C is a bias signal injection table illustrating a plurality of bias test conditions which may be generated within the FIG. 2 self-test circuit.
FIG. 6D provides one example of gain error, phase error, and offset error test conditions which may be generated within the FIG. 2 self-test circuit.

As shown in FIG. 6C, there are eight ($2^3$) bias modes which may be selected at the path 124. Also, there are four data cases, A, B, C and D, where A equals successive samples of 0,0; B equals successive samples 0,1; C equals successive samples 1,0; and, D equals successive samples 1,1. An offset is produced by the offset generation circuit 122 in accordance with the bias mode value and the data case. For example, with data case D, (data samples equal 1,1), FIG. 6D illustrates bias being applied to gain error, phase error, and offset error.

Another method for injecting a bias onto the ideal pseudo samples is to use the channel FIR filter 36 to add a gain or phase bias to the pseudo samples going into the particular loop error generating circuit, i.e. digital timing control 38, digital gain control 40 or digital DC offset control 42. This method for injecting bias is applicable to preamble as well as data. Phase bias is introduced by programming FIR filter coefficients such that the group delay of the resulting filter structure is not an integer number of clock periods. Gain bias may be introduced by programming the FIR filter coefficients such that the gain of the resulting filter structure is not unity at the preamble frequency. This alternative method presupposes that all of the FIR filter coefficients may be externally programmed, as by the microcontroller 84, for example. By using the FIR filter and the bias generation circuit 122, one can, in practice, add more than one bias type at a time. Actually, all biases may be added to the noise samples at the same time. Also, mis-equalization can be introduced by setting the FIR filter coefficients to values which will misequalize the ideal samples. In this way the detector may be more fully exercised, and the self-adaptation algorithm of the FIR filter may also be more fully exercised.

Figure 7:
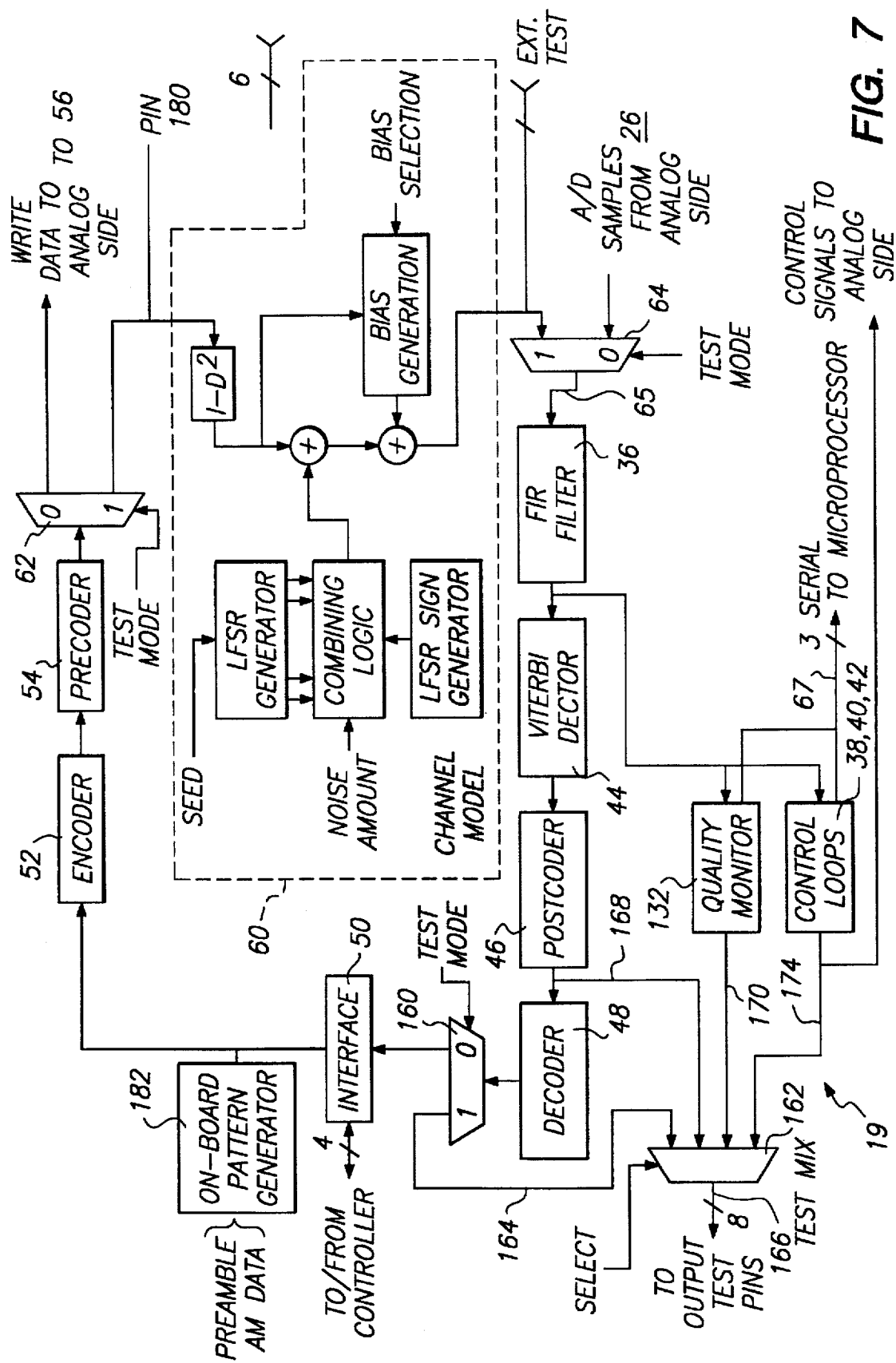
FIG. 7 is a detailed block diagram of the test circuit shown in FIG. 1, along with digital circuit elements being tested, and aiding in generating the desired test conditions.

Further understanding and appreciation of principles of the present invention may be obtained from consideration of FIG. 7. In FIG. 7, channel circuit elements previously established in the FIGS. 1 and 2 drawings bear the same reference numerals, and will not be described in any greater detail. In FIG. 7 it is assumed that the write path, including encoder 52 and precoder 54 do not have any common structural elements with the read path, including FIR filter 36, Viterbi detector 44, postcoder 46 and decoder 48. In presently preferred designs, some degree of circuit implementation commonality may be present. The example of FIG. 7 will require more gates in the IC than those designs offering structural commonality.

In the FIG. 7 example, a known data pattern is injected via the controller interface 50, just as though the pattern were to be written to disk. However, since the chip 19 is in the test mode, the data will not be written to disk, but will be diverted via selector 62 to the test block 60. As explained, the test block 60 generates a sequence of pseudo samples from the diverted, coded data, and those pseudo samples are substituted for real samples by the selector 64 and then passed through the FIR filter 36, Viterbi detector 44, postcoder 46 and decoder 48. Since the controller dam interface 50 is being used to inject the known digital data pattern, it is unavailable for the processed pseudo samples leaving the decoder 48. Accordingly, an additional selector 160 diverts digital output from the decoder 48 to a further selector 162 via a path 164. The selector 162 is for selecting and putting out test values via a bus 166 comprising e.g. eight test pins. Other paths available to the selector 162 include a path 168 from an output of the postcoder 46, a path 170 from an output of a quality monitor 172, and a path 174 from the control loops 38, 40 and 42, for example.

The quality monitor circuit 172 is included within the chip 19 in order to optimize the data channel. However, during self-test mode, it is used to monitor chip functions. For example, if the data going into the channel is known, and the noise is known, if a suitable number of samples are accumulated, e.g. 4000 samples, and if the samples are always of a known value, the channel processing results should yield samples corresponding to the known value. If the chip 19 is working properly, all of the gates and functional processes will work and behave properly in accordance with the chip design. If, for example, one known value injected into the digital processes is 4950, and the chip consistently returns e.g. 4949, or 4951, for example, this repeatable discrepancy becomes a chip "signature" which provides a clue to misfunctionality of the chip. Other forms of signature analysis may be employed, such as controlling the output of a certain logical block with a LFSR and retrieving the syndrome.

In the FIG. 7 example, the diverter circuit 62 may be replaced with a single pin 180 which simplifies the chip design at the expense of an additional external connection pin. Also, as designed, the channel chip 19 includes a state machine which expects a certain sequence of data patterns, such as a preamble pattern, followed by an address mark pattern, followed by a data pattern, etc. In order to provide testing, the pattern design must be observed. This ordering is implicit in operation of the data controller 74. However, if desired, the controller path could be disconnected at the interface 50, and an internal pattern generator 182 implemented within the test block 60. The pattern generator 182 would generate a predetermined sequence of known data patterns in a sequence expected by the channel, as emulative of e.g. preamble, address mark, data, etc. With this alternative implementation, the channel chip 19 can be commanded to perform self-test without requiring installation of the chip within a hard disk drive circuit board, or without an external controller. Before the chip is placed onto the circuit board, it is tested on an ATE test appliance. This test appliance and test setup may readily emulate the drive ASIC and microcontroller functions.

Thus, it will be understood and appreciated that the present invention provides a method for testing the digital section of a PRML channel chip, by incorporating a special test circuit within the chip. The test circuit, e.g. block 60, has a plurality of functions, including generating ideal partial response samples of any polynomial, such as e.g., class IV (PR4) samples from an external or internal serial source. The test circuit adds e.g. white noise to the ideal samples. The test circuit also adds a bias to the samples to create an artificial DC offset, phase or gain error. The bias and the noise are used to exercise the digital sections of gain, offset and timing control loops, thereby providing greater fault coverage than heretofore available.

The channel chip 19 is exercised by sending a stream of data through pins normally used by the data controller 74 for writing data to disk. The data stream is exactly the same format used for writing a pattern onto the disk 12. The data is encoded and precoded, but instead of being sent to the analog section of the chip for write precompensation, the encoded and precoded serialized data is diverted into the on-chip test circuit 60.

The serial data stream is then converted into ideal e.g. PR4 samples using e.g. a 1-$D^2$ operation, where D represents a unit delay operator. An internal circuit including elements 108, 112 and 114 generates additive white noise which is added to this signal. The noisy signal is injected to the input of an on-chip finite impulse response (FIR) filter 36, bypassing the samples from the analog to digital converter 26 in the analog section 21 of the channel chip 19. There should be enough noise, as an option, to test every possible input code through the FIR filter 36. The samples then follow the normal read data path of the digital section of the chip, including passing through the Viterbi detector 44, the postcoder 46, and the decoder 48. The output of the decoder 48 is diverted to the test output pins for external storage of diverted samples and comparison with expected sample values. The samples at the output of the FIR filter also feed the quality monitor 122 and control loop circuits, such as digital timing 38, digital gain 40 and digital offset 42 error extraction circuits. The outputs of these circuits can also be sent to the test output pins or their final values may be stored in on-chip registers for later retrieval via the serial port 67. The final values may also be compared inside the channel chip to hard-coded expected values. A miscompare enables an error flag which is read externally via the serial port 67.

During a factory test (AP test) a test machine is used in lieu of the actual hard disk drive electronics to command and monitor the on-board tests performed by the test block 60. However, since the test block 60 remains active and available for testing after printed circuit assembly, the drive firmware may command self testing of the digital section 21 by the test block 60 and record the test results in memory 72 or in a track on disk 12. If the drive fails, it is possible to quiz the synchronous data detection channel from the drive ASIC 70 and obtain a digital signature as a result of the on-chip test process implemented by the test block 60. If there is a defect in the digital elements of the channel chip, this situation can be readily determined and reported.

To those skilled in the art, many changes and modifications will be readily apparent from consideration of the foregoing description of a preferred embodiment without departure from the spirit of the present invention, the scope thereof being more particularly pointed out by the following claims. The descriptions herein and the disclosures hereof are by way of illustration only and should not be construed as limiting the scope of the present invention which is more particularly pointed out by the following claims.

What is claimed is:

1. A method for in-chip testing of a digital section of an application specific integrated circuit (ASIC) chip implementing a synchronous sampling data detection channel, the digital section including at least an input node nominally for receiving digital values from an analog to digital converter, an in-chip test block; and, a digital memory path detector, the method comprising the steps of:

injecting a sequence of known digital values from a source into the input node, generating a sequence of pseudo samples from the sequence of known digital values within the pseudo sample generator, generating a controlled amount of digital noise within the digital noise generator, and adding the digital noise to the pseudo samples at the summing circuit to produce noisy pseudo samples, selectively passing the noisy pseudo samples through the digital memory path detector to produce a test value indicative of detected pseudo samples, and storing the test value as a chip signature into a chip signature storage circuit.

2. The method for in-chip testing of a digital section of a synchronous sampling data detection channel set forth in claim 1 wherein the digital section further comprises at least one digital filter connected upstream of the digital memory path detector, and comprising the further step of filtering the sequence of noisy pseudo samples with the digital filter into filtered noisy pseudo samples optimized to a predetermined spectrum response matching a nominal response of the channel before the step of passing the filtered noisy pseudo samples through the digital memory path detector.

3. The method for in-chip testing of a digital section of a synchronous sampling data detection channel set forth in claim 1 wherein the digital section further comprises at least one digital filter having a plurality of adjustable coefficients, the digital filter connected upstream of the digital memory path detector and comprising the further steps of adjusting the coefficients of the digital filter to a predetermined spectrum response different from a nominal response of the channel and passing the sequence of noisy pseudo samples through the adjusted digital filter to produce filtered noisy pseudosamples before passing them through the digital memory path detector thereby to test the digital memory path detector over an extended data detection range.

4. A method for in-chip testing of a digital section of an application specific integrated circuit (ASIC) chip implementing a synchronous sampling data detection channel, the digital section including an input, an in-chip test block having a test input, one digital filter, at least one control loop digital error generator, and a digital memory path detector, the method comprising the steps of:

injecting a sequence of known digital values from a source into the test input, passing the sequence of known digital values through a pseudo sample generator connected to the test input to produce a sequence of pseudo samples optimized to a predetermined spectrum response matching a nominal spectrum response of the channel, generating a controlled amount of digital noise within a digital noise generator of the digital error generator, adding the digital noise to the sequence of pseudo samples at a first summing circuit to generate a sequence of noisy pseudo samples, adding a predetermined controlled amount of bias to the sequence of noisy pseudo samples at a second summing circuit to produce a sequence of biased, noisy pseudo samples, passing the sequence of biased, noisy, pseudo samples through the digital filter, and the digital memory path detector to produce a sequence of detected pseudo samples comparing the sequence of detected pseudo samples with the sequence of known digital values in a comparison circuit to determine any sequence miscompares, and storing any sequence miscompares as a chip signature into a miscompare storage circuit for later extraction and analysis off the chip.

5. The method for in-chip testing of a digital section of an application specific integrated circuit (ASIC) chip implementing a synchronous sampling data detection channel as set forth in claim 4 wherein the digital section includes at least one control loop, and comprises the further steps of:

passing the sequence of biased, noisy, pseudo samples through the the control loop to produce a sequence of detected control loop digital errors, comparing the sequence of detected control loop digital errors with nominal digital errors expected from the sequence to determine any control loop digital error miscompares, and storing any control loop digital error miscompares as a chip signature into the miscompare storage circuit for later extraction and analysis off the chip.

6. An on-chip self-test circuit for testing digital circuits of a synchronous sampling data detection channel chip including an analog channel section, an analog-to-digital converter for convening synchronous samples received into the analog channel section from a channel into digital samples, and a digital channel section including the digital circuits with digital pseudo samples representative of samples coming from the analog channel section, the self-test circuit comprising:

a test circuit input for receiving a binary test sequence from a source, sample generator means for generating a sequence of idealized digital pseudo samples from the binary test sequence in accordance with a predetermined spectrum, digital noise generator means for generating a sequence of digital noise values, first combining means for combining the sequence of idealized digital pseudo samples with the sequence of digital noise values to produce a sequence of noisy pseudo samples, bias injection means connected to the sample generator means for adding a predetermined bias to the sequence of idealized digital pseudo samples to produce a sequence of bias values, second combining means for combining the sequence of noisy pseudo samples with the sequence of bias values to produce and put out a sequence of biased noisy pseudo samples for testing of digital channel and control elements of the channel chip, switching means for passing the sequence of biased noisy pseudo samples through a selected one of the digital circuits of the channel chip in lieu of the digital samples from the analog-to-digital converter, and test output means selectively connected to an output of one of the digital circuits to provide an output as a test result.

7. The on-chip self-test circuit set forth in claim 6 wherein the digital noise generator means comprises a first linear feedback shift register for generating the sequence of digital noise values from a first predetermined primitive polynomial, a second linear feedback shift register for generating a sequence of digital noise sign values from a second predetermined primitive polynomial, and combining logic for combining the sequence of digital noise values with the sequence of digital sign values in accordance with a noise amount to produce the sequence of digital noise values.

8. The on-chip self-test circuit set forth in claim 7 wherein the first linear feedback shift register has a width of 12 bits and implements a primitive polynomial $x^{12}+x^6+x^4+x+1$.

9. The on-chip self-test circuit set forth in claim 7 wherein the second linear feedback shift register has a width of 3 bits and implements a primitive polynomial $x^3+x+1$.

10. The on-chip self-test circuit set forth in claim 6 wherein the sample generator means generates samples in accordance with a predetermined polynomial $P(D)=h(0)+h(1)D+h(2)D^2+\ldots h(n)D^N$, where D is a unit delay operator.

11. The on-chip self-test circuit set forth in claim 10 wherein the sample generator means includes a polynomial filter circuit for converting the binary test sequence into the sequence of idealized digital pseudo samples having an idealized partial response, class IV, spectrum in accordance with a polynomial $P(D)=1-D^2$.

12. The on-chip self-test circuit set forth in claim 6 wherein the channel chip includes a digital channel timing control circuit and wherein the predetermined bias added by the bias injection means comprises a timing phase bias for producing a .sequence of timing biased pseudo samples for testing the digital timing control circuit.

13. The on-chip self-test circuit set forth in claim 6 wherein the channel chip includes a digital channel gain control circuit and wherein the predetermined bias added by the bias injection means comprises a gain bias for producing a sequence of gain biased pseudo samples for testing the digital channel gain control circuit.

14. The on-chip self-test circuit set forth in claim 6 wherein the channel chip includes a digital direct current (DC) offset control circuit and wherein the predetermined bias added by the bias injection means comprises a DC offset bias for producing a sequence of DC offset biased pseudo samples for testing the digital DC offset control circuit.

15. An application specific integrated circuit (ASIC) chip implementing a synchronous sampling data detection channel having a digital section comprising:

an in-chip test block including:

a test circuit input for receiving a sequence of known digital values, sample generator means for generating a sequence of idealized digital pseudo samples from the sequence of known digital values at the test circuit input in accordance with a predetermined spectrum response, digital noise generator means for generating a sequence of digital noise values, and first combining means for combining the sequence of idealized digital pseudo samples with the sequence of digital noise values to produce a sequence of noisy pseudo samples, a digital memory path detector connected to receive and process the sequence noisy pseudo samples to produce a sequence of detected pseudo samples, and a comparison circuit connected to receive and compare the sequence of detected pseudo samples with the sequence of known digital values in a comparison circuit to determine any miscompares.

16. The ASIC set forth in claim 15 wherein the in-chip test block further includes:

bias injection means connected to the sample generator means for adding a predetermined bias to the sequence of idealized digital pseudo samples to produce a sequence of biased pseudo samples, second combining means connected to the first combining means and to the bias injection means for combining the sequence of noisy pseudo samples with the sequence of biased pseudo samples to produce and put out a sequence of biased noisy pseudo samples.

17. The ASIC set forth in claim 16 further comprising a digital channel timing control element and wherein the predetermined bias added by the bias injection means comprises a timing phase bias for producing a sequence of timing biased pseudo samples for testing the digital timing control element.

18. The ASIC set forth in claim 16 further comprising a digital channel gain control element and wherein the predetermined bias added by the bias injection means comprises a gain bias for producing a sequence of gain biased pseudo samples for testing the digital channel gain control element.

19. The ASIC set forth in claim 16 further comprising a digital direct current (DC) offset control element and wherein the predetermined bias added by the bias injection means comprises a DC offset bias for producing a sequence of DC offset biased pseudo samples for testing the digital DC offset control element.

20. The ASIC set forth in claim 16 further comprising at least one digital filter connected upstream of the digital memory path detector for filtering the sequence of noisy pseudo samples, the digital filter including means for adjusting filter digital coefficients to optimize the digital filter for filtering the noisy pseudo samples to a predetermined spectrum matching a nominal spectrum response of the channel at an input to the the digital memory path detector.

21. The ASIC set forth in claim 16 further comprising at least one digital filter having a plurality of adjustable coefficients, the digital filter connected upstream of the digital memory path detector and including means for adjusting the coefficients of the digital filter to a predetermined spectrum response different from a nominal response of the channel, the digital filter for filtering the sequence of noisy pseudo samples to produce filtered noisy pseudosamples before passage through the digital memory path detector, whereby an extended data detection range of the digital memory path detector may be tested.

* * * * *